US009257974B1

(12) United States Patent
Chen et al.

(10) Patent No.: US 9,257,974 B1
(45) Date of Patent: Feb. 9, 2016

(54) QUADRATURE PHASE RELAXATION OSCILLATOR

(71) Applicant: National Chiao Tung University, Hsinchu (TW)

(72) Inventors: Wei-Zen Chen, Hsinchu (TW); Zheng-Hao Hong, Hsinchu (TW); Yao-Chia Liu, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 14/582,916

(22) Filed: Dec. 24, 2014

(30) Foreign Application Priority Data

Sep. 24, 2014 (TW) .............................. 103132945 A

(51) Int. Cl.
*H03K 3/26* (2006.01)
*H03K 4/52* (2006.01)
*H03K 3/0231* (2006.01)

(52) U.S. Cl.
CPC ................ *H03K 4/52* (2013.01); *H03K 3/0231* (2013.01)

(58) Field of Classification Search
CPC ..................................................... H03K 3/0231
USPC .......................... 331/111, 143, 135, 57, 2, 46
See application file for complete search history.

(56) References Cited

U.S. PATENT DOCUMENTS 6,462,626 B1 * 10/2002 Gharpurey ............. H03B 27/00
329/304
7,075,377 B2 * 7/2006 Metaxakis ............. H03B 27/00
331/117 R

* cited by examiner

*Primary Examiner* — Arnold Kinkead
(74) *Attorney, Agent, or Firm* — Muncy, Geissler, Olds & Lowe, P.C.

(57) ABSTRACT

A low voltage quadrature phase wideband relaxation oscillator. An ultra-wideband tuning range from Mega to Giga Hz order is also realized by tuning the I/Q coupling factor, zeros and poles. Preferably, a novel synchronous quadrature injection lock is proposed to validate low noise performance.

12 Claims, 6 Drawing Sheets

QUADRATURE PHASE RELAXATION OSCILLATOR

BACKGROUND OF THE INVENTION

1. Field of the Invention

The present invention relates to a relaxation oscillator, and more particularly to a quadrature phase relaxation oscillator.

2. Description of the Prior Art

Normally speaking, oscillators are common to use in various types of clock generator circuits, but traditional relaxation oscillators with high noise performance cannot be widely utilized in high frequency wired transmission systems or radio frequency circuits. Therefore, inductance-capacitor oscillators (LC oscillators) with low noise performance are more common to use and be applied in high frequency wired transmission systems or radio frequency wireless communication modules as transceivers, but have drawbacks of larger area and narrower frequency tuning range. Quadrature phase relaxation oscillators, compared to the LC oscillators, have smaller areas and wider frequency tuning ranges. However, a well-known quadrature phase relaxation oscillator is achieved by merely changing the capacitor of the source electrode or the loading resistor to modulate the relaxation oscillating frequency of the output signals. Thus, the quadrature phase relaxation oscillators are unable to achieve the tuning range from Mega to Giga Hz order and difficult to be applied in various types of high standard systems for the obvious inferiority of worse phase noise performance.

In summary, it is highly desirable to provide a novel synchronous quadrature phase relaxation oscillator having an ultra-wideband tuning range and a better phase noise performance.

SUMMARY OF THE INVENTION

The present invention is directed to a quadrature phase relaxation oscillator realized by two relaxation oscillators coupled in anti-phase. An ultra-wideband tuning range from Mega to Giga Hz order can be realized by tuning current sources (or a common source electrode current source), oscillator current sources, oscillator capacitors, or oscillator resistors in the quadrature phase relaxation oscillator.

In one embodiment of the present invention, the proposed quadrature phase relaxation oscillator comprises a first relaxation oscillator, a second relaxation oscillator, a first current source circuit, a second current source circuit, a third current source circuit, and a fourth current source circuit. The first relaxation oscillator comprises a first output end and a second output end configured for respectively providing a first output signal and a second output signal, wherein the phase difference between the second output signal and the first output signal is 180 degrees. The second relaxation oscillator comprises a third output end and a fourth output end configured for respectively providing a third output signal and a fourth output signal, wherein the phase difference between the fourth output signal and the third output signal is 180 degrees and the phase difference between the fourth output signal and the first output signal is more than 180 degrees. The first current source circuit is electrically connected to the first output end, controlled by the fourth output signal, and selectively providing a first current to the first output end for synthesizing the first output signal. The second current source circuit is electrically connected to the second output end, controlled by the third output signal, and selectively providing a second current to the second output end for synthesizing the second output signal. The third current source circuit is electrically connected to the third output end, controlled by the first output signal, and selectively providing a third current to the third output end for synthesizing the third output signal. The fourth current source circuit is electrically connected to the fourth output end, controlled by the second output signal, and selectively providing a fourth current to the fourth output end for synthesizing the fourth output signal.

By this invention, it is beneficial for realizing a quadrature phase relaxation oscillator, which is applicably operated under low voltage supply and achieve an ultra-wideband tuning range by tuning current sources (or a common source electrode current source), oscillator current sources, oscillator capacitors, or oscillator resistors.

The objective, technologies, features and advantages of the present invention will become apparent from the following description in conjunction with the accompanying drawings wherein certain embodiments of the present invention are set forth by way of illustration and example.

BRIEF DESCRIPTION OF THE DRAWINGS

The foregoing conceptions and their accompanying advantages of this invention will become more readily appreciated after being better understood by referring to the following detailed description, in conjunction with the accompanying drawings, wherein.

DESCRIPTION OF THE PREFERRED EMBODIMENT

The detailed explanation of the present invention is described as follows. The described preferred embodiments are presented for purposes of illustrations and description, and they are not intended to limit the scope of the present invention.

Figure 1:
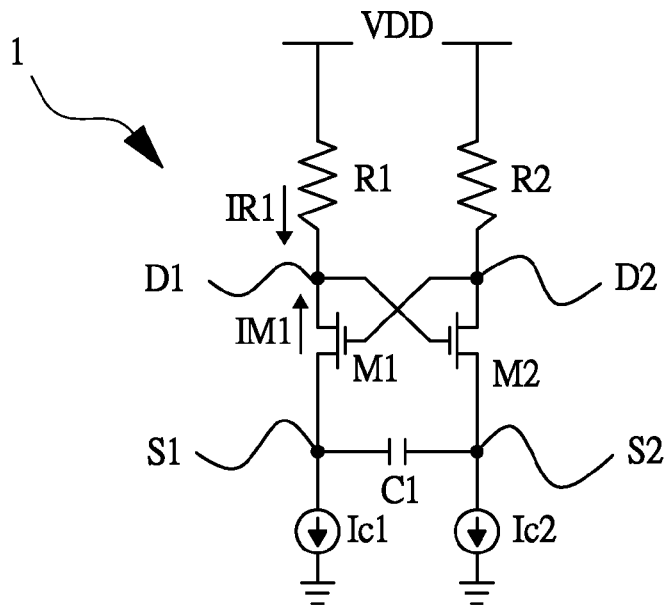
FIG. 1 is an electrical circuit diagram schematically illustrating a prior art of a relaxation oscillator.

A circuit design of a relaxation oscillator 1 consists of a source-degeneration current mode logic latch. Referring to FIG. 1, the circuit layout comprises a first resistor R1, a second resistor R2, a first capacitor C1, a first oscillator transistor M1, a second oscillator transistor M2, a first oscillator current source Ic1, and a second oscillator current source Ic2. Wherein, the first resistor R1 has one end connected to a high voltage supply and the other end connected to a source electrode of the first oscillator transistor M1. The node between the first resistor R1 and the drain electrode of the first oscillator transistor M1 is configured as the first output end D1. The first oscillator current source Ic1 has one end connected to the source electrode of the first oscillator transistor M1 and the other end connected to the ground. Correspondingly, the second resistor R2 has one end connected to a high voltage supply and the other end connected to the drain electrode of the second oscillator transistor M2. The node between the second resistor R2 and the drain electrode of the second oscillator transistor M2 is configured as the second output end D2. The second oscillator current source Ic2 has one end connected to the source electrode of the second oscillator transistor M2 and the other end connected to the ground. Further, the gate electrode of the first oscillator transistor M1 is connected to the second output end D2, and the gate of the second oscillator transistor M2 is connected to the first output end D1. In the end, the first capacitor C1 has one end connected to the source electrode of the first oscillator transistor M1 and the other end connected to the source electrode of the second oscillator transistor M2.

Referring further to FIG. 1, the basic operation principle of a relaxation oscillator 1 is illustrated as following. It supposes that the first oscillator transistor M1 is electrically open and the second oscillator transistor M2 is electrically short in the beginning in the circuit. The first oscillator current source Ic1 thus discharges the first source electrode node S1. As the voltage level of the first source electrode node S1 gets lower than a predetermined value, it will trigger the first oscillator transistor M1 to be electrically short and decrease the voltage level of the first output end D1, so as to trigger the second oscillator transistor M2 to be electrically open; then, the second oscillator current source Ic2 starts to discharge the second source electrode node S2, and the circuit operation repeats the similar steps as above. It is repeated and circulating for the first source electrode node S1 and the second source electrode node S2, i.e. the terminals of the first capacitor C1, to be charged and discharged according to a certain frequency. Hence, the first output end D1 and the second output end D2 are able to continuously generate a pair of clock signals having certain frequency.

Referring now to FIG. 2, for example, two relaxation oscillators are anti-phase coupled to realize a quadrature phase relaxation oscillator according to an embodiment of the invention. The quadrature phase relaxation oscillator comprises a first relaxation oscillator 1, a second relaxation oscillator 2, a first current source circuit 11, second current source circuit 12, third current source circuit 21, and a fourth current source circuit 22. The first relaxation oscillator 1 has a first output end D1 and a second output end D2 configured for respectively providing a first output signal Id1 and a second output signal Id2. The second relaxation oscillator 2 has a third output end D3 and a fourth output end D4 configured for respectively providing a third output signal Id3 and a fourth output signal Id4. The first current source circuit 11 is electrically connected respectively to the first output end D1 and the fourth output end D4. The second current source circuit 12 is electrically connected respectively to the second output end D2 and the third output end D3. The third current source circuit 21 is electrically connected respectively to the third output end D3 and the first output end D1. The fourth current source circuit 22 is electrically connected respectively to the fourth output end D4 and the second output end D2.

In this embodiment, the first current source circuit 11 is controlled by the fourth output signal Id4 and selectively providing a first current I1 to the first output end D1 for synthesizing the first output signal Id1; the second current source circuit 12 is controlled by the third output signal Id3 and selectively providing a second current I2 to the second output end D2 for synthesizing the second output signal Id2; the third current source circuit 21 is controlled by the first output signal Id1 and selectively providing a third current I3 to the third output end D3 for synthesizing the third output signal Id3; and the fourth current source circuit 22 is controlled by the second output signal Id2 and selectively providing a fourth current I4 to the fourth output end D4 for synthesizing the fourth output signal Id4. As mentioned before, the phase difference between the second output signal Id2 and the first output signal Id1 is substantially 180 degrees, and the phase difference between the fourth output signal Id4 and the third output signal Id3 is substantially 180 degrees. Further, for the first relaxation oscillator 1 and the second relaxation oscillator 2 coupled in anti-phase, as the first output signal Id1 is in the comparative high level, the fourth output signal 414 is in the comparative low level. In other words, the phase difference between the fourth output signal Id4 and the first output signal Id1 is more than 180 degrees.

Figure 3A:
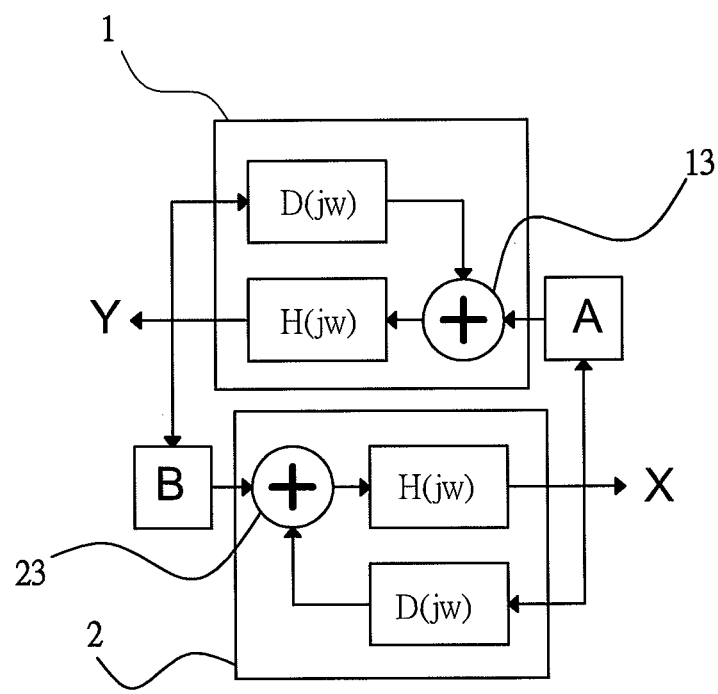
FIG. 3a is a block diagram schematically illustrating a quadrature phase relaxation oscillator according to an embodiment of the invention.
Figure 3B:
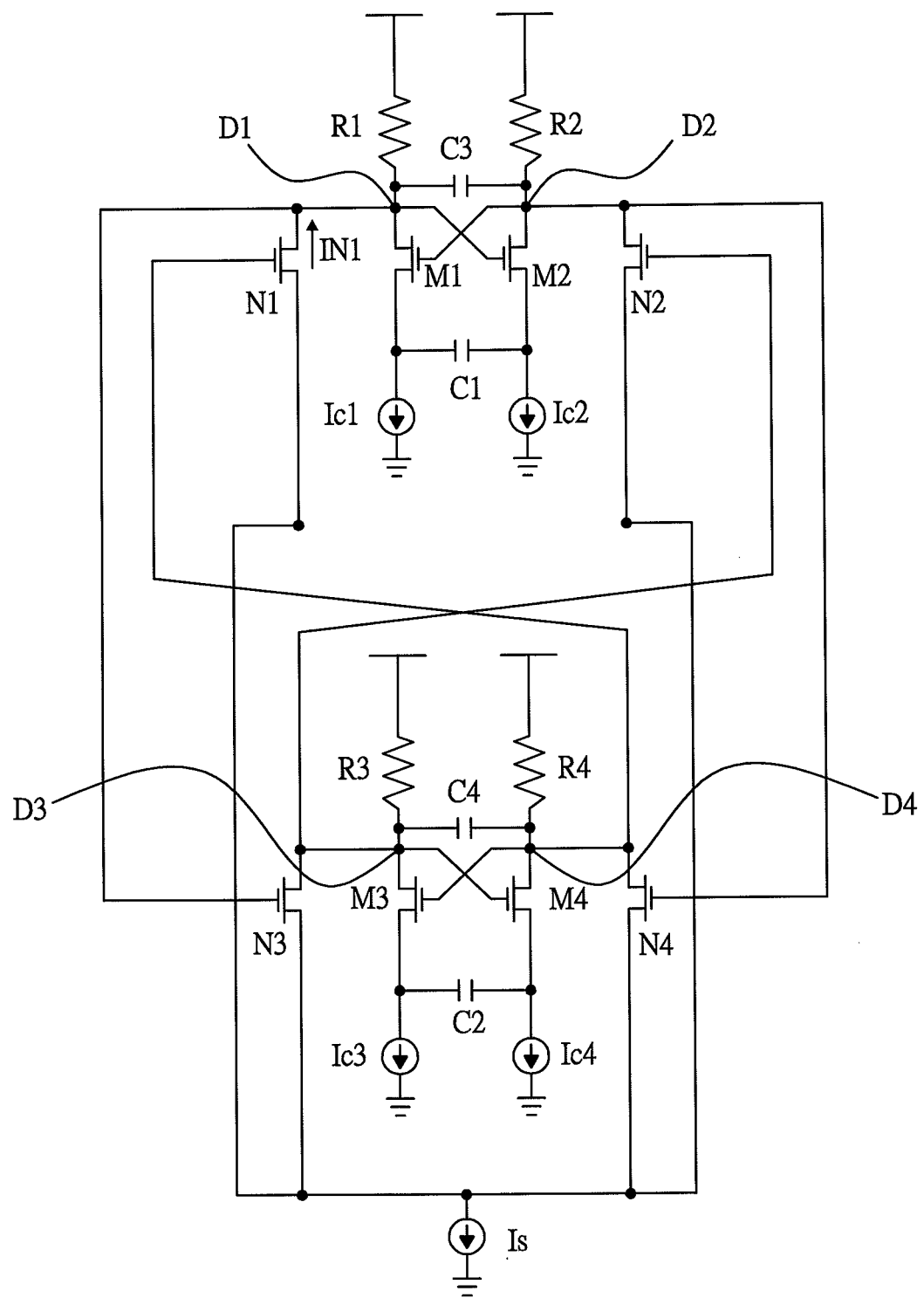
FIG. 3b is an electrical circuit diagram schematically illustrating a quadrature phase relaxation oscillator according to an embodiment of the invention.

Referring now to FIG. 3b, for example, the first relaxation oscillator 1 may have a first oscillator current source Ic1 and a second oscillator current source Ic2 respectively correspond to the first output end D1 and the second output end D2. The second relaxation oscillator 2 may have a third oscillator current source Ic3 and a fourth oscillator current source Ic4 respectively correspond to the third output end D3 and the fourth output end D4. And, the currents provided by the first oscillator current source Id1, the second oscillator current source Ic2, the third oscillator current source Ic3, and the fourth oscillator current source Ic4 are respectively different from the currents provided by the first current source circuit 11, the second current source circuit 12, the third current source circuit 21, and the fourth current source circuit 22. In another embodiment, the first current source circuit 11 comprises a first transistor N1 having a drain electrode electrically connected to the first output end D1, a gate electrode electrically connected to the fourth output end D4, and a source electrode electrically connected to a first current source (not shown in the figure); the second current source circuit 12 comprises a second transistor N2 having a drain electrode electrically connected to the second output end D2, a gate electrode electrically connected to the third output end D3, and a source electrode electrically connected to a second current source (not shown in the figure); the third current source circuit 21 comprises a third transistor N3 having a drain electrode electrically connected to the third output end D3, a gate electrode electrically connected to the first output end D1, and a source electrode electrically connected to a third current source (not shown in the figure); and the fourth current source circuit 22 comprises a fourth transistor N4 having a drain electrode electrically connected to the fourth output end D4, a gate electrode electrically connected to the second output end D2, and a source electrode electrically connected to a fourth current source (not shown in the figure). It can be learned that the first current source circuit 11, the second current source circuit 12, the third current source circuit 21, and the fourth current source circuit 22 may share a common source electrode current source Is and have the advantage of lower production cost and simplified circuit design.

Following explanation is the way to tune the output of a current source or an oscillator current source in order to modulate the oscillating frequency of the output signals in the quadrature phase relaxation oscillator. Hereunder, the definition of the coupling factor is the ratio of an output current by a current source of a current source circuit to an output current by an oscillator current source in a relaxation oscillator. For instance, the current value from the first current source is compared with the current value from the first oscillator current source Id1 to make the ratio as one coupling factor. Similarly, the current value from the third current source is compared with the current value from the first oscillator current source Ic3 to make the ratio as another coupling factor.

Figure 2A:
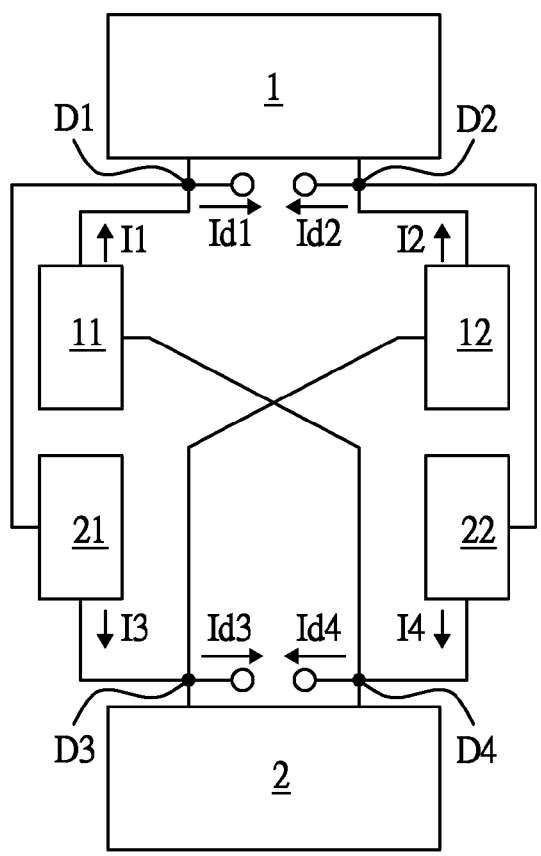
FIG. 2a is an block diagram schematically illustrating a quadrature phase relaxation oscillator according to an embodiment of the invention.
Figure 2B:
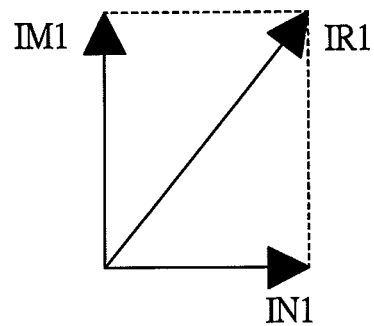
FIG. 2b is a diagram schematically illustrating the phase relationship of currents according to an embodiment of the invention.

By tuning the value of the coupling factor, the output phase is changed to modulate the oscillating frequency of the output signals in the quadrature phase relaxation oscillator. It would be more apparent for the persons skilled in the art to understand that, for example, how to modulate the oscillating frequency of the output signal by the first output end D1 as following. First, referring to FIG. 1 and FIG. 3b together, shown thereat is the first transistor current IN1 and the first oscillator current IM1. The first resistor current IR1 consists of the first transistor current IN1 and the first oscillator current IM1. Thus, the phase relationship among three currents as above-mentioned is shown in FIG. 2b. Referring to the block diagram in FIG. 2a, the first resistor current IR1 across the loading, i.e. the first resistor R1, is provided to the first output end D1 for synthesizing the first output signal Id1. It can be learned that the current phase from the first output end D1 must be the same as the current phase from the first oscillator current IM1, so the phase shift has to be operated by tuning the zeros and poles. Therefore, a different coupling factor will take a distinct phase shift, which corresponds to a distinct oscillating frequency. In other words, tuning the output of the current source of the current source circuit and the output of the oscillator current source in the relaxation oscillator is capable of changing the current ratio of the output current by the current source of the current source circuit to the output current by the oscillator current source in the relaxation oscillator, that is to say tuning the value of the coupling factor. For example, when the value of the coupling factor becomes larger, the oscillating frequency of the output signal gets higher so as to gain the corresponding phase shift. In summary, by tuning the output current of the current source of the current source circuit and the output current of the oscillator current source in the relaxation oscillator, the oscillating frequency of the output signal is accordingly modulated. In similar manners, tuning the oscillating frequency of the output signals from the second output end D2, the third output end D3, and the fourth output end D4 is operated on the same principle.

It can be learned that under the circuit design which operates phase shift by tuning the zeros and poles, tuning the loading resistors or the capacitors of the source electrode in the quadrature phase relaxation oscillator will also modulate the phase shift. For example, the first capacitor C1 is a variable capacitor, or the first resistor R1 is a variable resistor. Hence, besides by tuning the current source or the oscillator current source, the modulation of the oscillating frequency of the output signals is realized by tuning the loading resistors or the capacitors of the source electrode in the quadrature phase relaxation oscillator. It is apparent for the persons skilled in the art to realize an ultra-wideband frequency tuning range according to the above-mentioned features.

Referring again to FIG. 3b, in one embodiment, the first relaxation oscillator 1 further comprises a third capacitor C3 connected between the drain electrode of the first oscillator transistor M1 and the drain electrode of the second oscillator transistor M2; and the second relaxation oscillator 2 further comprises a fourth capacitor C4 connected between the drain electrode of the third oscillator transistor M3 and the drain electrode of the fourth oscillator transistor M4. The result of the modulation of the oscillating frequency of the output signals may be achieved by tuning the capacitance value of the third capacitor C3 or the fourth capacitor C4. Specifically speaking, according to one embodiment of the present invention, it is beneficial for the advanced process integration and the realization of a quadrature phase wideband relaxation oscillator, which has an ultra-wideband tuning range from Mega to Giga Hz order for the oscillating frequency of the output signals by tuning current sources, oscillator current sources, oscillator capacitors, or oscillator resistors in the quadrature phase relaxation oscillator.

Following illustration will further explain how to implement a locked quadrature phase relaxation oscillator. Referring to FIG. 2a, FIG. 3b, and FIG. 3B together, the first current source circuit 11, the second current source circuit 12, the third current source circuit 21, and the fourth current source circuit 22 share a common source electrode current source Is. The first transistor N1, the second transistor N2, the third transistor N3, and the fourth transistor N4 are the n-type metal-oxide-semiconductor (NMOS) transistors of the same electrical characteristics. The currents provided by the first oscillator current source Id1, the second oscillator current source Ic2, the third oscillator current source Ic3, and the fourth oscillator current source Ic4 are the same, as shown in FIG. 3b. Meanwhile, the first relaxation oscillator 1 and the second oscillator relaxation 2 are coupled in anti-phase with differential pairs sharing the common source electrode current source Is, as shown in FIG. 3a. Wherein, the H(jw) represents an output loading transform equation; D(jw) represents a source degeneration transform equation; A represents a first differential component; B represents a second differential component; 13 represents a first summing junction; 23 represents a second summing junction; X represents a pair of output signals by the first relaxation oscillator 1; and Y represents a pair of output signals by the second relaxation oscillator 2. Further referring to FIG. 3a and FIG. 3b together, for example, the first transistor N1 corresponds to the first differential component A, and the fourth transistor N4 corresponds to the second differential component B. Because the first relaxation oscillator 1 and the second oscillator relaxation 2 are coupled in anti-phase with differential pairs, the conducting abilities of the first transistor N1 and the fourth transistor N4 are negative correlation with each other with time, as indicated in equation (1). Then as following, derive equation (2) and (3) from equation (1) and obtain the solution (4) after algebra operation. It can be understand that, the conducting abilities of the second transistor N2 and the third transistor N3 are negative correlation with each other with time and also apply to the above-mentioned equation (1)-(4). Herein, the unnecessary details are omitted. Seeing from the solution (4) X=±jY, the output signals will be in quadrature phase when the two relaxation oscillators are coupled in anti-phase. It is noted that, the two relaxation oscillators are coupled in anti-phase with differential pair circuit so that the phase difference keeps in 90 degrees at any time among the quadrature phases of the output signals. In other words, a locked quadrature phase relaxation oscillator is provided according to this embodiment of the invention.

$$A = -B \qquad (1)$$

$$[AX+YD(jw)]H(jw)=Y \qquad (2)$$

$$[-AX+XD(jw)]H(jw)=X \qquad (3)$$

$$X=\pm jY \qquad (4)$$

Further note that, in this embodiment shown in FIG. 3b, the first oscillator transistor current IM1, the current values of the first oscillator transistor current IM1, the second oscillator transistor current IM2, the third oscillator transistor current IM3 and the fourth oscillator transistor current IM4 are the same; and the current values of the first transistor current IN1, the second transistor current IN2, the third transistor current IN3 and the fourth transistor current IN4 are the same. Therefore, the values of their coupling factors are the same, indicated as the following identities:

Coupling Factor=$IN1/IM1=IN2/IM2=IN3/IM3=IN4/IM4$

It is well-known that, same coupling factors correspond to the same oscillating frequency, leading to the same phase shift. Thus, this embodiment of the invention can provide a locked quadrature phase relaxation oscillator having pairs of quadrature output signals with the same frequency. That is to say, the phase difference keeps in 90 degrees among the quadrature phases of the output signals. In other words, the phase difference between the second output signal Id2 and the first output signal Id1 is 180 degrees; the phase difference between the fourth output signal Id4 and the third output signal Id3 is 180 degrees; the phase difference between the third output signal Id3 and the first output signal Id1 is 90 degrees; and the phase difference between the fourth output signal Id4 and the first output signal Id1 is 270 degrees.

Figure 4:
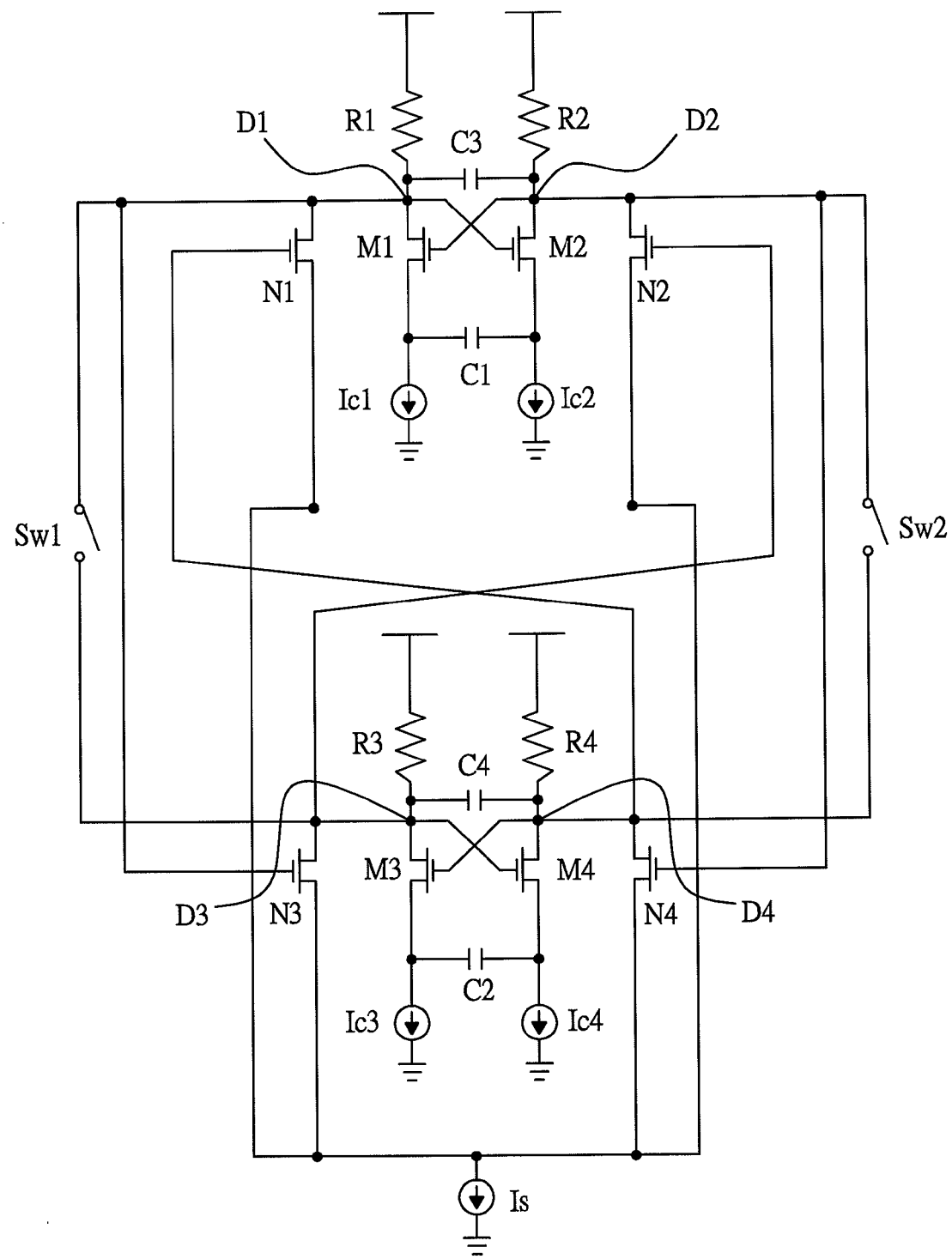
FIG. 4 is an electrical circuit diagram schematically illustrating a quadrature phase relaxation oscillator according to another embodiment of the invention.

Referring now to one embodiment in FIG. 4, based on the above-mentioned locked quadrature phase relaxation oscillator, a pair of switches, respectively the first switch Sw1 and the second switch Sw2, are provided in the circuit design. Wherein, the first switch Sw1 is connected between the first output end D1 and the third output end D3, and the second switch Sw2 is connected between the second output end D2 and the fourth output end D4. According to this design, an injection locked quadrature phase relaxation oscillator is realized. The phenomenon of injection lock is a fundamental property of oscillators. This property has been noted to occur where a reference signal having a frequency near the frequency of the free running oscillator is introduced into the oscillator circuit. Injection locking refers to the coupling of a signal from a reference source into an oscillator for improving the frequency or phase difference stability of the output signals generated by the oscillator.

Figure 5:
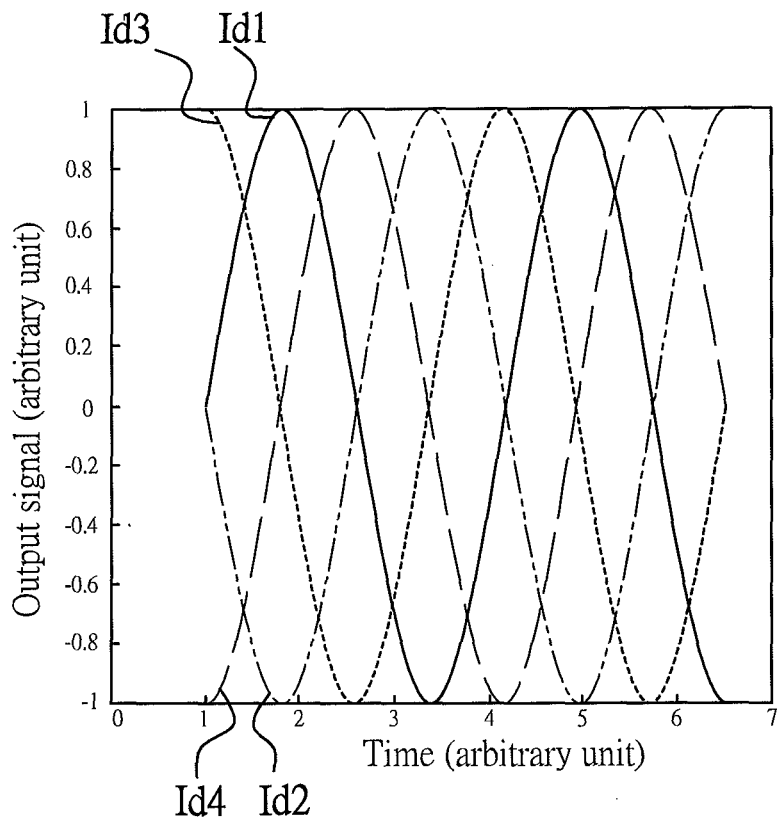
FIG. 5 is a diagram schematically illustrating the signal phase variation with time of a quadrature phase relaxation oscillator according to an embodiment of the invention.
Figure 6A:
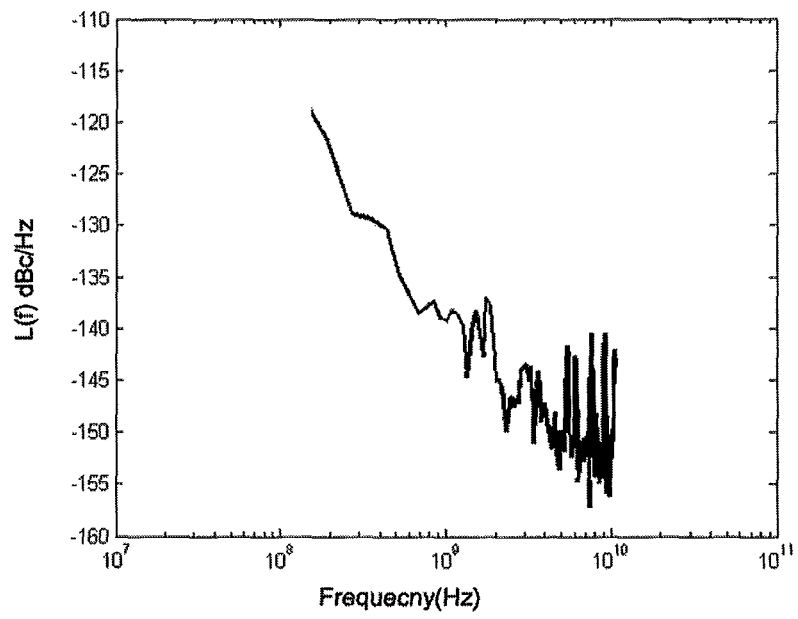
FIG. 6a is a diagram schematically illustrating the phase noise variation with frequency of a quadrature phase relaxation oscillator without injection locked according to an embodiment of the invention.
Figure 6B:
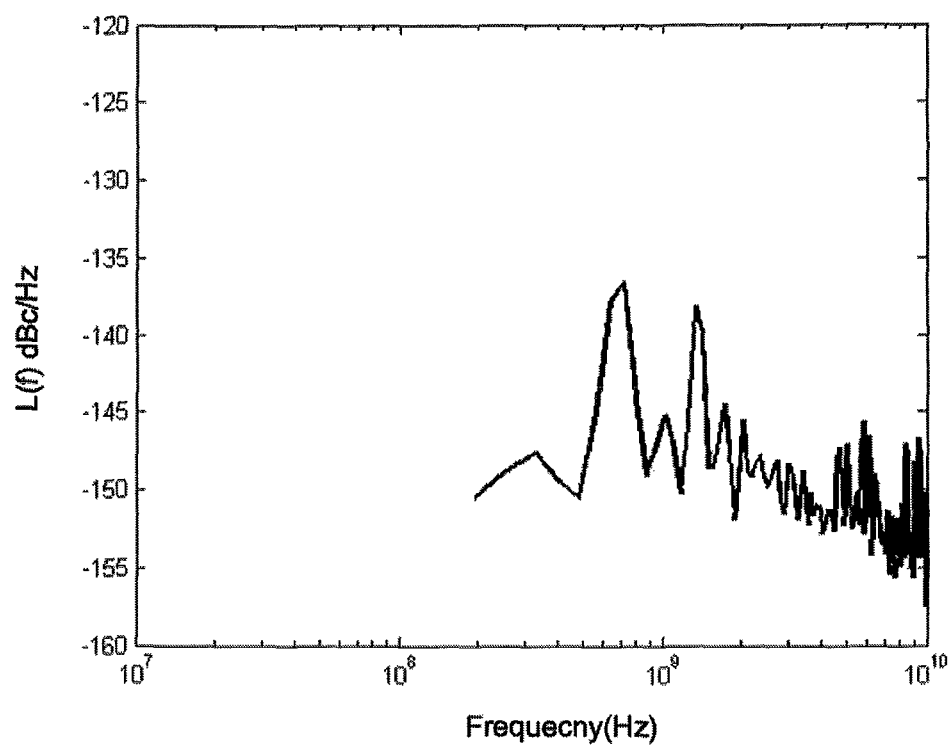
FIG. 6b is a diagram schematically illustrating the phase noise variation with frequency of a quadrature phase relaxation oscillator with injection locked according to an embodiment of the invention.

Further illustration is referring to the FIG. 4 and FIG. 5 together as following. As the time sequence goes, the first output signal Id1 and the third output signal Id3 both vary and intersect at time points when having the same voltage level (i.e. equal amplitude); and so do the second output signal Id2 and the fourth output signal Id4. Define the time point mentioned above as an injection time point, which is suitable for injecting an oscillating signal. Considering a stable and ideal oscillator with no phase noise, the injection time point is just the time point when two pairs of signals respectively have intersecting events at the same time, as shown in FIG. 5. In order to overcome the unstable frequency or intrinsic phase noise phenomenon in an oscillator in realistic condition, at the injection time point, when the first switch Sw1 conducts electricity between the first output end D1 and the third output end D3 and the second switch Sw2 conducts electricity between the second output D2 end and the fourth output D4 in a simultaneous manner, the synchronous injection locking is validated by coupling of the four output signals for reducing the intrinsic phase noise and having better phase noise performance of the four output signals generated by the oscillator. Referring now to FIG. 6a and FIG. 6b, respectively illustrating the phase noise performance of a quadrature phase relaxation oscillator before and after injection locking, it can be learned that the injection locked quadrature phase relaxation oscillator has better phase noise performance than a normal quadrature phase relaxation oscillator. In short, according to an embodiment of the invention, using the circuit design comprising two relaxation oscillators and a pair of switches, the quadrature phase relaxation oscillator achieves better phase noise performance by searching the intersecting events among the four output signals at the injection time points and simultaneously injection locking the four output signals for effectively synchronizing the frequency or the phase difference stability.

In summary, according to an embodiment of the present invention it is beneficial for the advanced process integration and the realization of a quadrature phase wideband relaxation oscillator, which has an ultra-wideband tuning range from Mega to Giga Hz order for the oscillating frequency of the output signals by tuning current sources, oscillator current sources, oscillator capacitors, or oscillator resistors in the quadrature phase relaxation oscillator. Preferably, synchronous injection locking to the quadrature phase of the output signals can gain a better phase noise performance in a quadrature phase relaxation oscillator.

It can be understood that, the drain electrode output ends of the two oscillators are coupled in anti-phase with differential pairs to compose the quadrature phase relaxation oscillator. It is applicably operated under the low voltage supply of 1 volt and beneficial for realizing an advanced process component with low energy consumption, such as a nano-scale semiconductor process component. Further, comparing to the circuit design of the well-known Voltage Controlled Oscillator (VCO), the quadrature phase relaxation oscillator according to an embodiment of the invention has the advantage of realizing a chip of simplified circuit design and smaller area so as to lower the production cost and shorten the design time.

In addition, according to an embodiment of the invention the injection locked quadrature phase oscillator generates pairs of output signals having the same frequency and quadrature phases. In this embodiment, using the circuit design comprising two relaxation oscillators and a pair of switches, the quadrature phase oscillator achieves better phase noise performance by searching the intersecting events among the four output signals at the injection time points and simultaneously injection locking the four output signals for effectively synchronizing the frequency or the phase difference stability.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A quadrature phase relaxation oscillator comprising:
a first relaxation oscillator comprising a first output end and a second output end configured for respectively providing a first output signal and a second output signal, wherein the phase difference between the second output signal and the first output signal is 180 degrees;
a second relaxation oscillator comprising a third output end and a fourth output end configured for respectively providing a third output signal and a fourth output signal, wherein the phase difference between the fourth output signal and the third output signal is 180 degrees and the phase difference between the fourth output signal and the first output signal is more than 180 degrees;

a first current source circuit, electrically connected to the first output end, controlled by the fourth output signal, and selectively providing a first current to the first output end for synthesizing the first output signal;

a second current source circuit, electrically connected to the second output end, controlled by the third output signal, and selectively providing a second current to the second output end for synthesizing the second output signal;

a third current source circuit, electrically connected to the third output end, controlled by the first output signal, and selectively providing a third current to the third output end for synthesizing the third output signal; and a fourth current source circuit, electrically connected to the fourth output end, controlled by the second output signal, and selectively providing a fourth current to the fourth output end for synthesizing the fourth output signal.

2. The quadrature phase relaxation oscillator according to claim 1, wherein the first relaxation oscillator comprises a first oscillator current source and a second oscillator current source respectively corresponding to the first output end and the second output end, and the second relaxation oscillator comprises a third oscillator current source and a fourth oscillator current source respectively corresponding to the third output end and the fourth output end;

wherein the currents provided by the first oscillator current source, the second oscillator current source, the third oscillator current source, and the fourth oscillator current source are respectively different from the currents provided by the first current source circuit, the second current source circuit, the third current source circuit, and the fourth current source circuit.

3. The quadrature phase relaxation oscillator according to claim 1, wherein the first current source circuit comprises a first transistor having a drain electrode electrically connected to the first output end, a gate electrode electrically connected to the fourth output end, and a source electrode electrically connected to a first current source;

the second current source circuit comprises a second transistor having a drain electrode electrically connected to the second output end, a gate electrode electrically connected to the third output end, and a source electrode electrically connected to a second current source;

the third current source circuit comprises a third transistor having a drain electrode electrically connected to the third output end, a gate electrode electrically connected to the first output end, and a source electrode electrically connected to a third current source; and the fourth current source circuit comprises a fourth transistor having a drain electrode electrically connected to the fourth output end, a gate electrode electrically connected to the second output end, and a source electrode electrically connected to a fourth current source.

4. The quadrature phase relaxation oscillator according to claim 3, wherein the first current source circuit, the second current source circuit, the third current source circuit, and the fourth current source circuit share a common source electrode current source.

5. The quadrature phase relaxation oscillator according to claim 3, wherein the first transistor, the second transistor, the third transistor, and the fourth transistor comprise the NMOS of the same electrical characteristics.

6. The quadrature phase relaxation oscillator according to claim 1, further comprising:

a first switch, electrically connected between the first output end and the third output end, and electrically conducting or isolating between the first output end and the third output end selectively, and a second switch, electrically connected between the second output end and the fourth output end, and electrically conducting or isolating between the second output end and the fourth output end selectively;

wherein the first switch or the second switch are electrically conducting and injection locked to an oscillating signal of a low degree of phase noise, when the first output signal and third output signal have the same voltage level or when the second output signal and fourth output signal have the same voltage level.

7. The quadrature phase relaxation oscillator according to claim 1, wherein the first relaxation oscillator comprises:

a first resistor, having one end connected to a high voltage supply;

a first oscillator transistor, having a drain electrode connected to the other end of the first resistor, and having a gate electrode connected to the second output end, wherein the node between the first resistor and the drain electrode of the first oscillator transistor is configured as the first output end;

a first oscillator current source, having one end connected to a source electrode of the first oscillator transistor, and having the other end connected to the ground;

a second resistor, having one end connected to a high voltage supply;

a second oscillator transistor, having a drain electrode connected to the other end of the second resistor, and having a gate electrode connected to the first output end, wherein the node between the second resistor and the drain electrode of the second oscillator transistor is configured as the second output end;

a second oscillator current source, having one end connected to a source electrode of the second oscillator transistor, and having the other end connected to the ground; and a first capacitor, having one end connected to the source electrode of the first oscillator transistor, and having the other end connected to the source electrode of the second oscillator transistor; and wherein the second relaxation oscillator comprises:

a third resistor, having one end connected to a high voltage supply;

a third oscillator transistor, having a drain electrode connected to the other end of the third resistor, and having a gate electrode connected to the fourth output end, wherein the node between the third resistor and the drain electrode of the third oscillator transistor is configured as the third output end;

a third oscillator current source, having one end connected to a source electrode of the third oscillator transistor, and having the other end connected to the ground;

a fourth resistor, having one end connected to a high voltage supply;

a fourth oscillator transistor, having a drain electrode connected to the other end of the fourth resistor, and having a gate electrode connected to the third output end, wherein the node between the fourth resistor and the drain electrode of the fourth oscillator transistor is configured as the fourth output end;

a fourth oscillator current source, having one end connected to a source electrode of the fourth oscillator transistor, and having the other end connected to the ground; and a second capacitor, having one end connected to the source electrode of the third oscillator transistor, and having the other end connected to the source electrode of the fourth oscillator transistor.

8. The quadrature phase relaxation oscillator according to claim 7, wherein the first relaxation oscillator further comprises a third capacitor connected between the drain electrode of the first oscillator transistor and the drain electrode of the second oscillator transistor; and wherein the second relaxation oscillator further comprises a fourth capacitor connected to the drain electrode of the third oscillator transistor and the drain electrode of the fourth oscillator transistor.

9. The quadrature phase relaxation oscillator according to claim 7, wherein the currents provided by the first oscillator current source, the second oscillator current source, the third oscillator current source, and the fourth oscillator current source are different from the currents provided by the first current source circuit, the second current source circuit, the third current source circuit, and the fourth current source circuit.

10. The quadrature phase relaxation oscillator according to claim 7, wherein the currents provided by the first oscillator current source, the second oscillator current source, the third oscillator current source, and the fourth oscillator current source are the same.

11. The quadrature phase relaxation oscillator according to claim 7, wherein each of the first oscillator current source, the second oscillator current source, the third oscillator current source, and the fourth oscillator current source comprises a source-degeneration current mode logic latch.

12. The quadrature phase relaxation oscillator according to claim 1, wherein the first output signal, the second output signal, the third output signal, and the fourth output signal comprise wideband frequency modulated signals from 100 MHz to 10 GHz.

* * * * *